United States Patent
Hwang et al.

(10) Patent No.: US 10,991,383 B2
(45) Date of Patent: Apr. 27, 2021

(54) METHOD OF MEASURING SOUND LEVEL OF AUDIO CONTENT AND DEVICE THEREFOR

(71) Applicant: SAMSUNG ELECTRONICS CO., LTD., Suwon-si (KR)

(72) Inventors: Inwoo Hwang, Suwon-si (KR); Sunmin Kim, Suwon-si (KR); Kiwoong Kang, Suwon-si (KR); Kibeom Kim, Suwon-si (KR); Hoon Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/713,231

(22) Filed: Dec. 13, 2019

(65) Prior Publication Data

US 2020/0194030 A1    Jun. 18, 2020

(30) Foreign Application Priority Data

Dec. 18, 2018 (KR) .......................... 10-2018-0164308

(51) Int. Cl.
*G10L 25/51*    (2013.01)
*G06F 16/22*    (2019.01)

(52) U.S. Cl.
CPC .......... *G10L 25/51* (2013.01); *G06F 16/2255* (2019.01)

(58) Field of Classification Search
CPC .. H03G 3/20; H03G 3/24; H03G 1/04; H03G 3/001; H03G 2201/508; H03G 7/002;
(Continued)

(56) References Cited

U.S. PATENT DOCUMENTS 7,242,784 B2    7/2007    Cranfill et al.
2005/0015252 A1    1/2005    Marumoto
2018/0357037 A1    12/2018    Lau

FOREIGN PATENT DOCUMENTS

KR    10-1998-0084515 A    12/1998
KR    101998084515        * 12/1998
(Continued)

OTHER PUBLICATIONS

International Search Report (PCT/ISA/210) and Written Opinion (PCT/ISA/237) dated Mar. 31, 2020 issued by the International Searching Authority in International Application No. PCT/KR2019/017790.

*Primary Examiner* — Kile O Blair
(74) *Attorney, Agent, or Firm* — Sughrue Mion, PLLC

(57) ABSTRACT

Provided are a method and a device for identifying a sound level of audio content, the method including receiving an audio signal and obtaining a first hash address based on a sound level of the audio signal, providing a hash address database in which the sound level of the audio signal is made to correspond to a hash address among a plurality of hash addresses, based on a first sound level corresponding to the first hash address and the sound level of the audio signal corresponding to the first sound level, cumulatively counting a first count value of the first hash address, and identifying the sound level of the audio content received during a first time period based on count information corresponding to a total amount of the first count value accumulated during the first time period.

19 Claims, 10 Drawing Sheets

(58) Field of Classification Search
CPC .. H03G 7/007; H03G 3/3089; H04R 2430/01; H04R 2499/15
USPC ......................................................... 381/107
See application file for complete search history.

(56) References Cited

FOREIGN PATENT DOCUMENTS

| | | |
|---|---|---|
| KR | 10-0812028 B1 | 3/2008 |
| KR | 10-1520938 B1 | 5/2015 |
| KR | 101520938 B1 * | 5/2015 |
| KR | 10-1679712 B1 | 11/2016 |

* cited by examiner

METHOD OF MEASURING SOUND LEVEL OF AUDIO CONTENT AND DEVICE THEREFOR

CROSS-REFERENCE TO RELATED APPLICATION

This application is based on and claims priority under 35 U.S.C. § 119 to Korean Patent Application No. 10-2018-0164308, filed on Dec. 18, 2018, in the Korean Intellectual Property Office, the disclosure of which is incorporated by reference herein in its entirety.

BACKGROUND

1. Field

The disclosure relates to a method of measuring a sound level of audio content and a device.

More particularly, the disclosure relates to a method of automatically controlling a sound level of an electronic device by measuring a sound level of audio content received by the electronic device and a device thereof.

2. Description of Related Art

The supply of electronic devices and progress in technology have allowed users to reproduce various types of content on electronic devices. For example, a user is now able to reproduce not only TV broadcasts but also various types of audio-video (AV) content on various devices, such as a TV, a tablet, or a portable terminal through an Internet streaming service.

In line with this, consumers demand various types of content to be reproduced, and content suppliers are providing content that meets such user demand. The content to be reproduced includes not only image information but also audio information. For example, reproduced content such as radio broadcasts, standardized regular broadcasts, personal broadcast contents produced from various production environments or real-time streaming contents may include audio information. Hereinafter, reproduced content including audio information may be referred to as an audio content.

A user may adjust a sound level that suits the user's preference by using an input module included in an electronic device when reproducing audio content. However, a reference sound level of audio content may vary among content suppliers, and users have the inconvenience of having to re-adjust a sound level each time when a reproduced audio content changes. For example, while a user is watching a broadcast program at a certain sound level, when an advertisement broadcast is provided in the middle of watching, the sound level may increase automatically even though the user did not change the sound level. The user may then be inconvenienced by the sound level that has suddenly changed.

Accordingly, a sound level of received audio content may need to be measured to provide audio content at a sound level desired by a user.

Thus, there is a use for a method and device for accurately measuring a sound level of audio content to reproduce audio content having a comfortable sound level for a user.

SUMMARY

Provided are a method of measuring a sound level of audio content by using a hash address database and a device thereof.

Also provided are a method of automatically adjusting a sound level of a received audio signal based on a measured sound level of audio content and a device therefor.

Additional aspects will be set forth in part in the description which follows and, in part, will be apparent from the description, or may be learned by practice of embodiments of the disclosure.

In accordance with an aspect of the disclosure, there is provided a method of identifying a sound level of an audio content, the method including: receiving an audio signal and obtaining a first hash address based on a sound level of the audio signal; providing a hash address database in which the sound level of the audio signal is made to correspond to a hash address among a plurality of hash addresses; based on a first sound level corresponding to the first hash address and the sound level of the audio signal corresponding to the first sound level, cumulatively counting a first count value of the first hash address; and identifying the sound level of the audio content received during a first time period based on count information corresponding to a total amount of the first count value accumulated during the first time period.

The first sound level may correspond to a sound level included in a first section based on a sound level range being divided into a plurality of sections at intervals, and the providing the hash address database may further include providing the hash address database in which each hash address among the plurality of hash addresses is made to correspond to a section among the plurality of sections.

The cumulatively counting may further include, based on the sound level of the audio signal being included in the first section, identifying that the sound level of the audio signal corresponds to the first sound level.

A size of the intervals may be inversely related to a capacity of the hash address database.

The identifying the sound level of the audio content may further include identifying an average sound level of the audio content based on sound level information that includes the first sound level and the count information.

The first time period may be a time period during which the identified average sound level of the audio content converges within a certain error range.

The method may further include, based on the sound level of the audio signal being less than or equal to a certain value, identifying that a period of silence has occurred and initializing the count information stored in the hash address database.

The initializing may include adjusting all count values included in the count information to 0.

The method may further include identifying a compensation gain based on a difference between the identified sound level of the audio content and a sound level of an audio signal received after the first time period.

The method may further include adjusting, by the compensation gain, the sound level of the audio signal received after the first time period.

In accordance with an aspect of the disclosure, there is provided a device for identifying a sound level of an audio content, the device including: a communicator configured to perform communication with an electronic device that reproduces audio content; a memory storing at least one instruction; and a controller including at least one processor for executing the at least one instruction to: receive an audio signal and obtain a first hash address based on a sound level of the audio signal; provide a hash address database in which the sound level of the audio signal is made to correspond to a hash address among a plurality of hash addresses; based on a first sound level corresponding to the first hash address and the sound level of the audio signal corresponding to the first sound level, cumulatively count a first count value of the first hash address; and identify the sound level of the audio content received during a first time period based on count information corresponding to a total amount of the first count value accumulated during the first time period.

The processor may be further configured to execute the at least one instruction to: adjust the first sound level to correspond to a sound level included in a first section based on a sound level range being divided into a plurality of sections at intervals; and provide the hash address database in which each hash address among the plurality of hash addresses is made to correspond to a section among the plurality of sections.

The processor may be further configured to execute the at least one instruction to identify, based on the sound level of the audio signal being included in the first section, that the sound level of the audio signal corresponds to the first sound level.

A size of the intervals may be inversely related to a capacity of the hash address database.

The processor may be further configured to execute the at least one instruction to identify an average sound level of the audio content based on sound level information that may include the first sound level and the count information.

The first time period may be a time period during which the identified average sound level of the audio content converges within a certain error range.

The processor may be further configured to execute the at least one instruction to identify, based on the sound level of the audio signal being less than or equal to a certain value, that a period of silence has occurred, and initialize the count information stored in the hash address database.

The processor may be further configured to execute the at least one instruction to adjust all count values included in the count information to 0.

The processor may be further configured to execute the at least one instruction to identify a compensation gain based on a difference between the identified sound level of the audio content and a sound level of an audio signal received after the first time period.

The processor may be further configured to execute the at least one instruction to adjust, by the compensation gain, the sound level of the audio signal received after the first time period.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
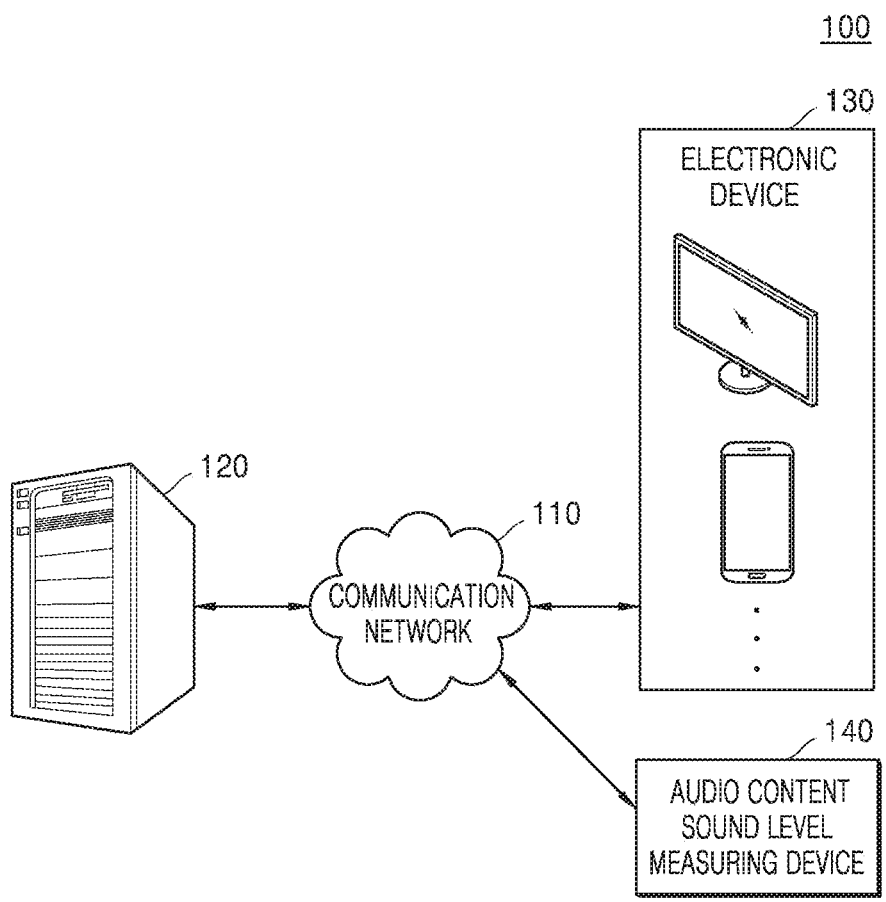
FIG. 1 is a view illustrating an audio content sound level measuring system, according to an embodiment of the disclosure.

Embodiments of the disclosure will now be described more fully with reference to the accompanying drawings, in which embodiments of the disclosure are shown such that one of ordinary skill in the art may easily work the disclosure. This disclosure may, however, be embodied in many different forms and should not be construed as limited to embodiments of the disclosure set forth herein. Also, elements not related to description are omitted in the drawings for clear description of the disclosure, and like reference numerals in the drawings denote like elements throughout the disclosure.

According to embodiments, a method and device may be capable of increasing the convenience and satisfaction of a user reproducing audio content.

Throughout the disclosure, it will also be understood that when an element is referred to as being "connected to" another element, it can be directly connected to the other element, or it can be electrically connected to the other element and intervening elements may be present. It will also be understood that when a component "includes" an element, unless there is another opposite description thereto, it should be understood that the component does not exclude another element but may further include another element.

In the disclosure, the expression "in some embodiments" or "an embodiment" does not necessarily indicate a same embodiment.

Some embodiments of the disclosure may be described in terms of functional block components and various processing steps. Some or all of such functional blocks may be realized by any number of hardware and/or software components configured to perform the specified functions. For example, the functional blocks according to the disclosure may be implemented by at least one processor or microprocessor or by circuit elements for specific functions. Also, for example, the functional blocks according to the disclosure may be implemented using various programming or scripting language Functional blocks may be implemented in algorithms that execute on one or more processors. Furthermore, the disclosure could employ any number of techniques according to the related art for electronics configuration, signal processing and/or data processing and the like. The terms such as "module" and "configuration" are used broadly and are not limited to mechanical or physical embodiments.

Furthermore, the connecting lines, or connectors shown in the various figures presented are intended to represent exemplary functional connections and/or physical or logical couplings between the various elements. It should be noted that many alternative or additional functional relationships, physical connections or logical connections may be present in a practical device.

Also, the expression 'at least one of A and B' indicates 'A or B' or 'A and B'.

Hereinafter, the disclosure will be described in detail with reference to the attached drawings.

Hereinafter, reproduced contents including audio information will be referred to as 'audio content' for convenience of description.

In an automatic sound level adjustment method according to a related art, a sound level of an audio signal received for a certain time period is measured, and the sound level is automatically adjusted when the measured sound level of the audio signal differs from that of an audio signal received after the certain time period, by a certain threshold. The time period during which an audio signal is measured is relatively short, and thus, compensation gains calculated from measurement sections vary among the sections, and a compensation gain applied to the audio signal as a whole is not uniform. Accordingly, a user may be inconvenienced as a sound level of the audio signal fluctuates over time.

Thus, a method of measuring a sound level of audio content during a time period during which a compensation gain of the entire audio signal is made uniform is required.

Throughout the disclosure, the expression "at least one of a, b, or c" indicates only a, only b, only c, both a and b, both a and c, both b and c, all of a, b, and c, or variations thereof.

Hereinafter, a method of measuring a sound level of audio content to provide a comfortable sound level for a user and a device according to the method will be described in detail with reference to FIGS. 1 through 9.

FIG. 1 is a view illustrating a system 100 for measuring a sound level of audio content, according to an embodiment of the disclosure.

Referring to FIG. 1, the system 100 for measuring a sound level of audio content, according to according to an embodiment of the disclosure may include a communication network 110, an audio content providing server 120, an electronic device 130, and an audio content sound level measuring device 140.

According to embodiments of the disclosure, the communication network 110 may include a wired and/or wireless communication network, and may be various communication networks such as a local area network (LAN), a metropolitan area network (MAN), a wide area network (WAN), or a world wide web (WWW).

In addition, the audio content providing server 120 according to an embodiment of the disclosure may communicate with the electronic device 130 via the communication network 110, and provide audio content according to a request from the electronic device 130. The audio content providing server 120 may be a server such as a standardized regular broadcasting server, a cable broadcasting server, a satellite broadcasting server, or an Internet portal server, but is not limited thereto and may also be any server providing audio content to the electronic device 130. For example, when the electronic device 130 is a TV, a tuner of the TV may be used to perform tuning such that a broadcasting signal is received via a channel requested by a user. The audio content providing server 120 may be a broadcasting company server corresponding to a tuned channel, and the broadcasting company server may transmit a broadcasting program, that is, certain audio content, to the electronic device 130 via the communication network 110.

According to another embodiment of the disclosure, the electronic device 130 may receive audio content from not only the audio content providing server 120 but also from hardware storing audio content, for example, a digital device such as an external hard disk or a DVD player.

In addition, according to an embodiment of the disclosure, the electronic device 130 may include any audio device that is capable of selectively reproducing at least one piece of audio content. For example, the electronic device 130 may include a TV, a smart TV, a personal computer (PC), a laptop computer, a mobile phone, a tablet PC, a navigation terminal, a smartphone, a personal digital assistant (PDA), a portable multimedia player (PMP), and a digital broadcast receiver. The electronic device 130 may not be limited to the above examples but include various types of devices.

In addition, according to an embodiment of the disclosure, the audio content sound level measuring device 140 may measure a sound level of audio content transmitted from the audio content providing server 120 to the electronic device 130. While the electronic device 130 and the audio content sound level measuring device 140 are described as being separately included in embodiments of the disclosure for the convenience of description, the audio content sound level measuring device 140 may also be included in the electronic device 130.

Figure 2:
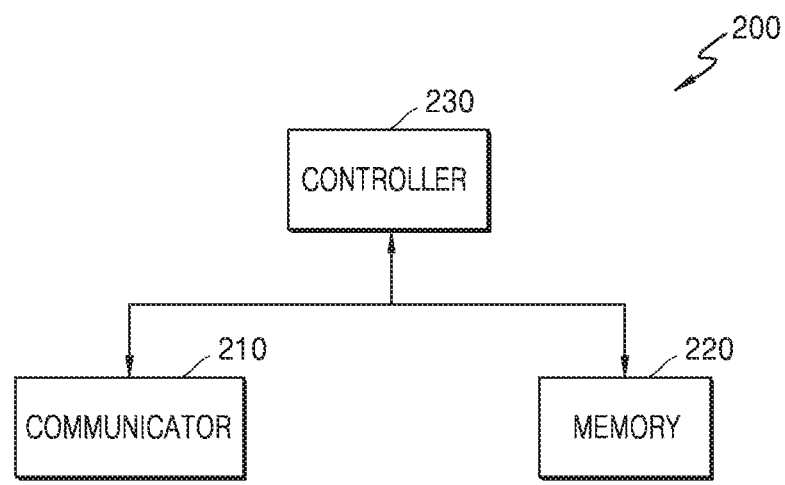
FIG. 2 is a block diagram of a device for measuring a sound level of audio content, according to an embodiment of the disclosure.

FIG. 2 is a block diagram of an audio content sound level measuring device 200 according to an embodiment of the disclosure. The audio content sound level measuring device 200 according to an embodiment of the disclosure may correspond to the audio content sound level measuring device 140 described with reference to FIG. 1.

Thus, details of the audio content sound level measuring device 200 that are already described above with reference to FIG. 1 will be omitted.

Referring to FIG. 2, the audio content sound level measuring device 200 according to an embodiment of the disclosure includes a communicator 210 performing communication with at least one electronic device capable of reproducing audio content, a memory 220 storing at least one instruction, and a controller 230 including at least one processor executing the at least one instruction. The processor receives an audio signal and generates a hash address database whereby a sound level of the audio signal may be made to correspond to a plurality of hash addresses. When a first sound level corresponds to a first hash address, and a sound level of the audio signal corresponds to the first sound level, the processor cumulatively counts a first count value of the first hash address, and controls to measure the sound level of the audio content that is received during a first time period based on count information including first count values accumulated during the first time period.

The communicator 210 may perform communication with at least one electronic device capable of reproducing audio content. In detail, the communicator 210 may receive an audio signal output when audio content is reproduced on an electronic device.

The communicator 210, according to an embodiment of the disclosure, includes at least one communication module such as a short-range communication module, a wired communication module, a mobile communication module, and a broadcasting receiving module. At least one communication module here refers to a communication module capable of performing data transmission and reception via a network according to communication standards such as a tuner performing broadcasting reception, Bluetooth, Wireless LAN (WLAN), Wi-Fi, Wireless broadband (Wibro), World Interoperability for Microwave Access (Wimax), Code Division Multiple Access (CDMA), Wideband Code Division Multiple Access (WCDMA) or the like.

The memory 220 according to an embodiment of the disclosure may include at least one type of storage medium selected from a flash memory type storage medium, a hard disk type storage medium, a multimedia card micro type storage medium, a card type memory (e.g., SD or XD memory), a random access memory (RAM), a static random access memory (SRAM), a read-only memory (ROM), an electrically erasable programmable read-only memory (EEPROM), a programmable read-only memory (PROM), a magnetic memory, a magnetic disc, or an optical disc.

The controller 230, according to an embodiment of the disclosure, includes at least one processor executing one or more instructions. Each of at least one processor may perform a certain operation by executing at least one instruction stored in the memory 220.

In addition, the controller 230 may include at least one processor executing at least one program stored in an internal memory. In detail, the internal memory of the controller 230 may store one or more instructions. At least one processor included in the controller 230 may perform a certain operation by executing at least one instruction stored in the internal memory of the controller 230.

In detail, the controller 230 may include a RAM that stores a signal or data input from the outside of the audio content sound level measuring device 200 or is used as a storage area corresponding to various operations performed in the audio content sound level measuring device 200, a ROM in which a control program and/or a plurality of instructions for controlling the audio content sound level measuring device 200 are stored, and at least one processor. The processor may include a graphic processor (a graphics processing unit (GPU)) for processing graphics corresponding to a video. The processor may be implemented using a system on chip (SoC) in which a core and a GPU are integrated. The processor may include a single core or a multi-core such as a dual-core, a triple-core, a quad-core or the like.

In addition, at least one processor included in the controller 230 may control operations performed in the audio content sound level measuring device 200 and control other components included in the audio content sound level measuring device 200 such that certain operations are performed. Accordingly, even when explaining a case where the controller 230 controls certain operations to be performed, it will be obvious that at least one processor included in the controller 230 may control certain operations to be.

Hereinafter, for convenience of description, in regard to when the controller 230 performs or controls a certain operation, an embodiment of the disclosure where a processor of the controller 230 executes at least one instruction stored in the memory 220 to perform a certain operation will be described.

The controller 230 may control, via the communicator 210, to receive an audio signal of audio content reproduced on an electronic device. In detail, the communicator 210 may receive an audio signal according to the control by the controller 230.

In addition, the controller 230 may receive a first hash address based on a sound level of a received audio signal. In detail, the controller 230 may obtain a first hash address by converting the sound level of the received audio signal to a hash address by using a certain hash function. A hash address is a search key for searching for stored data and may be used to search for an index of a hash address database stored in an array form. Accordingly, in a method of measuring a sound level of audio content, a sound level of audio content may be quickly measured by using a hash address when measuring a sound level of audio content.

A sound level of an audio signal may be represented as a sound pressure level (SPL) indicating an intensity of sound based on sound pressure, and an SPL is represented in decibels (dB). In addition, a sound level of an audio signal may be represented as a root mean square (RMS), and the RMS is represented in watts. Methods of representing a sound level of an audio signal are not limited to those described above, and any other method of representing an intensity of an audio signal may be used.

Hereinafter, the description will focus on a method of measuring a sound level of audio content based on a sound level of an audio signal measured with respect to SPL for convenience of description, but the method may also apply to a sound level of an audio signal measured with respect to RMS.

The controller 230 may generate a hash address database whereby a sound level of an audio signal may be made to correspond to one of a plurality of hash addresses. The controller 230 may here control the hash address database to be stored in the memory 220. That is, the controller 230 may generate a hash address database in which count values respectively corresponding to a plurality of hash addresses are stored, and may control a sound level of a received audio signal to correspond to one of the plurality of hash addresses.

In addition, the controller 230 may set, as a first sound level, one representative sound level included in a first section from among a plurality of sections at certain intervals, which are divided from a certain sound level range that an audio signal may have. In addition, the controller 230 may make the first sound level correspond to a first hash address.

For example, when a range of a sound level that an audio signal may have is −100.5 dB to −0.5 dB, the controller 230 may divide the range of the sound level into one hundred sections at intervals of 1 dB. That is, the controller 230 may set a section equal to or less than 0.5 dB and greater than −1.5 dB as a first section, a section equal to or less than −1.5 dB and greater than −2.5 dB as a second section, . . . , and a section equal to or less than −99.5 dB and greater than −100.5 dB as a hundredth section and set a median value included in each section as a representative sound level. In this case, a first sound level of the first section may be −1 dB; a second sound level of the second section may be −2 dB; and a hundredth sound level of the hundredth section may be −100 dB. When a sound level of a received audio signal is −21.23 dB, the sound level of the received audio signal is included in a twenty-first section which is −20.5 dB or less and greater than −21.5 dB, and thus, the controller 230 may obtain a twenty-first hash address based on the sound level of the received audio signal of −21.23 dB.

The smaller the intervals at which sections are divided, the more accurately a sound level of audio content may be measured, but the greater the capacity of a hash address database. That is, accuracy of measurement of a sound level of audio content is in a trade-off relation with the capacity of a hash address database. For example, when certain intervals at which a section is divided is 0.5 dB, representative sound levels may be respectively −0.5 dB, −1 dB, −1.5 dB, . . . , −100 dB. Accordingly, as the controller 230 may obtain a sound level of a corresponding audio signal at intervals of 0.5 dB, a measured sound level of audio content may be more accurate than when obtaining a sound level of an audio signal at intervals of 1 dB. Meanwhile, when measuring a sound level of audio content at intervals of 1 dB, one hundred hash addresses of a hash address database are required, whereas when measuring a sound level of audio content at intervals of 0.5 dB, two hundred hash addresses of a hash address database are required. That is, the greater the capacity of a hash address database, the more hash addresses may be included therein, and the accuracy of measurement of a sound level of audio content increases, but the trade-off is that a required memory and a required computational amount also increase. Accordingly, according to an embodiment of the disclosure, the controller 230 may adjust intervals at which a sound level range is divided, to adjust accuracy of a measured sound level of audio content according to a target value.

According to an embodiment of the disclosure, the controller 230 divides a certain sound level range into sections at certain intervals, and when a sound level of a received audio signal is included in a first section, the controller 230 obtains a first hash address corresponding to a first sound level.

According to another embodiment of the disclosure, the controller 230 may also set a first sound level corresponding to a first hash address and determine whether a sound level of a received audio signal corresponds to the first sound level to obtain a first hash address.

That is, the controller 230 may use any method of determining whether a sound level of a received audio signal corresponds to a first sound level, without being limited to a method of dividing a sound level range of an audio signal into a plurality of sections or calculating an approximated value of a received audio signal as described above.

Hereinafter, for convenience of description, an embodiment of the disclosure will be described, in which a sound level range that an audio signal may have is −100.5 dB to −0.5 dB, and the sound level range is divided into one hundred sections at intervals of −1 dB, and a first sound level of a first section is −1 dB, and a second sound level of a second section is −2 dB, . . . , and a hundredth sound level of a hundredth section is −100 dB.

According to an embodiment of the disclosure, when the first sound level corresponds to a first hash address, and a sound level of an audio signal corresponds to the first sound level, the controller 230 may cumulatively count a first count value of the first hash address.

In detail, before receiving a first audio signal, the controller 230 may initialize all count values stored in a hash address database to 0. Also, the controller 230 may control count values, which correspond to respective hash addresses, to be stored in a hash address database. For example, when an audio signal having a sound level of −21.23 dB is received, and the sound level of −21.23 dB corresponds to a twenty-first hash address, the controller 230 may cumulatively count a twenty-first count value of the twenty-first hash address to modify the twenty-first value from 0 to 1. When the first count value is cumulatively counted, the memory 220 may update a count value of the hash address database and store the same according to the control by the controller 230.

According to an embodiment of the disclosure, the controller 230 may measure a sound level of audio content received during a first time period based on count information including the first count value accumulated during the first time period. In detail, the controller 230 may calculate an average sound level of audio content based on a hash address including the first sound level and count information. According to the related art, a sound level of an audio signal is measured with respect to some sections of audio content and thus there is the problem that the sound level of audio content is differently measured according to measurement sections. However, according to embodiments of the disclosure, the controller 230 may set a first time period during which a sound level of audio content is to be measured. For example, when a sufficiently long first time period is set, an average sound level of certain audio content may be measured. A method of calculating the first time period and an average sound level will be described in detail below with reference to FIGS. 3 through 9.

Figure 3:
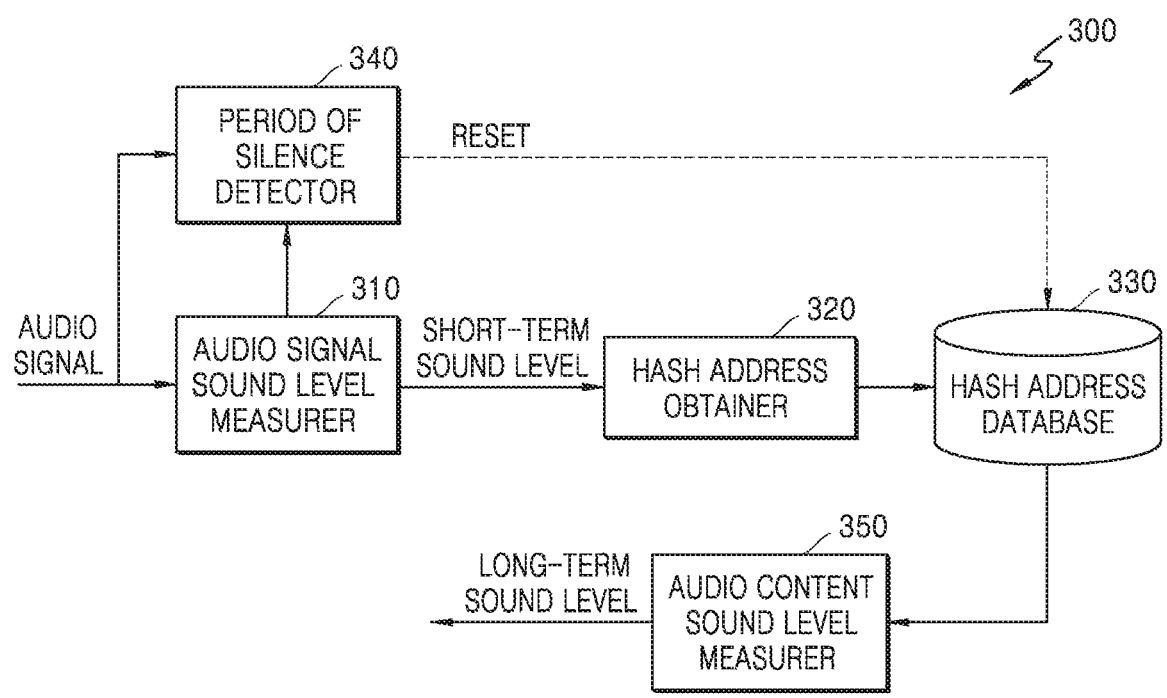
FIG. 3 is a detailed block diagram of a device for measuring a sound level of audio content, according to an embodiment of the disclosure.
Figure 4:
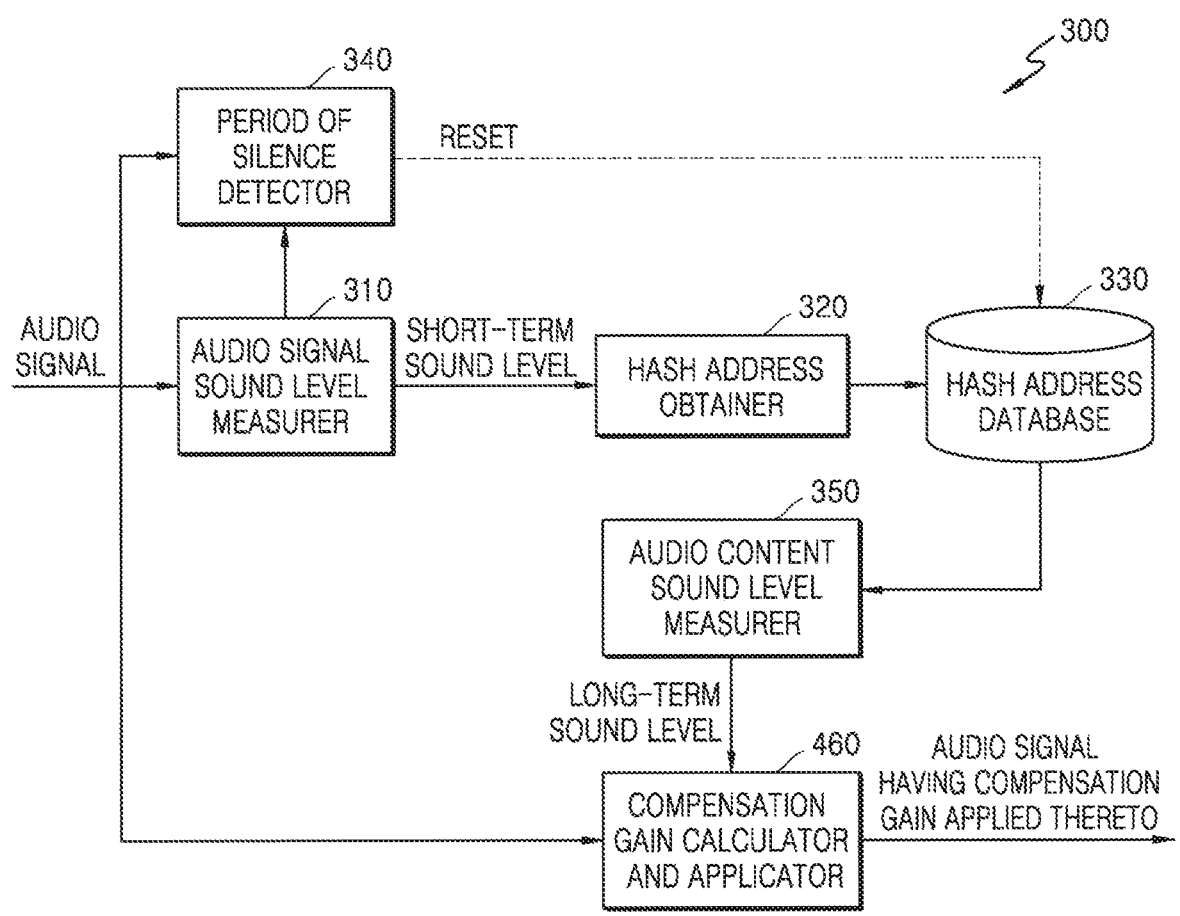
FIG. 4 is a block diagram of a device for measuring a sound level of audio content, according to another embodiment of the disclosure.

FIG. 3 is a detailed block diagram of an audio content sound level measuring device according to an embodiment of the disclosure, and FIG. 4 is a block diagram of an audio content sound level measuring device of another embodiment of the disclosure. An audio content sound level measuring device 300 according to an embodiment of the disclosure may correspond to the audio content sound level measuring device 200 described with reference to FIGS. 1 and 2.

Thus, details of the audio content sound level measuring device 300 that are already described above with reference to FIGS. 1 and 2 will be omitted.

Referring to FIG. 3, the audio content sound level measuring device 300 may include an audio signal sound level measurer 310, a hash address obtainer 320, a hash address database 330, a period of silence detector 340, and an audio content sound level measurer 350.

The controller 230 described above may perform operations of the audio signal sound level measurer 310, the hash address obtainer 320, the period of silence detector 340, and the audio content sound level measurer 350.

The audio signal sound level measurer 310 may measure a sound level of a received audio signal in real time and transfer the measured sound level of the audio signal to the hash address obtainer 320. The sound level of the received audio signal may correspond to a sound level corresponding to one frame which is a minimum unit of an input signal. The minimum unit, that is, one frame, may correspond to a relatively short time period section. For example, regarding an audio signal output at 60 pixel frames per second (FPS), an audio signal of 60 frames is output per second. In the above example, one frame, which is a minimum unit, may correspond to a relatively short time section at intervals of 1/60 of a second. Accordingly, here, a sound level of an audio signal measured by the audio signal sound level measurer 310 will be referred to as a 'short-term sound level'.

The hash address obtainer 320 may obtain a hash address based on a short-term sound level received from the audio signal sound level measurer 310. A method of obtaining a hash address corresponding to a received short-term sound level is as described above, and thus description thereof will be omitted.

The hash address database 330 may set, as an index, a hash address corresponding to a short-term sound level and store a count value corresponding to the hash address. Hereinafter, the hash address database 330 will be described with reference to FIG. 5.

FIG. 4 is a block diagram of a device for measuring a sound level of audio content according to another embodiment of the disclosure. Referring to FIG. 4, the audio content sound level measuring device 300 may further include a compensation gain calculator and applicator 460. Thus, details of the audio content sound level measuring device 300 that are already described above with reference to FIGS. 1 through 3 will be omitted.

According to an embodiment of the disclosure, the compensation gain calculator and applicator 460 may calculate a compensation gain used to compensate for a difference between a long-term sound level measured using the audio content sound level measurer 350 and a target sound level and apply the compensation gain to an audio signal input after a first time period to thereby automatically adjust a sound level. For example, when a long-term sound level of −20 dB is measured, and a target sound level is −15 dB, the compensation gain calculator and applicator 460 may calculate a compensation gain of 5 dB, and apply the calculated sound level of 5 dB to an audio signal input after a first time period.

According to another embodiment of the disclosure, the compensation gain calculator and applicator 460 may calculate a compensation gain based on a difference between a long-term sound level measured using the audio content sound level measurer 350 and a sound level of an audio signal received after a first time period. For example, when a long-term sound level of −20 dB is measured, and a sound level of an audio signal received after a first time period is −15 dB, to adjust the sound level of the audio signal received after the first time period to −20 dB as the long-term sound level, the compensation gain calculator and applicator 460 may calculate a compensation gain of −5 dB and apply the calculated sound level of −5 dB to the sound level of the audio signal input after the first time period.

The compensation gain calculator and applicator 460 may apply a compensation gain to the sound level of the audio signal. For example, the compensation gain calculator and applicator 460 may apply a compensation gain to the sound level of the audio signal at a signal terminal or an output terminal of the electronic device 130. The signal terminal of the electronic device 130 may include a module into which audio content is input. The output terminal of the electronic device 130 may include a module for adjusting a master volume of the electronic device 130. A master volume refers to a volume that decides the entire sound level of the electronic device 130 and may be used to finally adjust a volume of audio content that is determined by at least one mixer or amp.

In detail, when a master volume is adjustable by a user within a range from 0 to 100, the compensation gain calculator and applicator 460 may adjust a sound level of audio content by applying a compensation gain to the signal terminal of the electronic device 130 while the master volume is fixed. In addition, when outputting input audio content, the compensation gain calculator and applicator 460 may adjust a sound level of the audio content by adjusting the master volume at the output terminal of the electronic device 130. In this case, even when a user does not adjust the master volume, the master volume may be adjusted by an amount of a compensation gain calculated by the compensation gain calculator and applicator 460 of the electronic device 130, thereby adjusting the sound level of the audio content.

Figure 5:
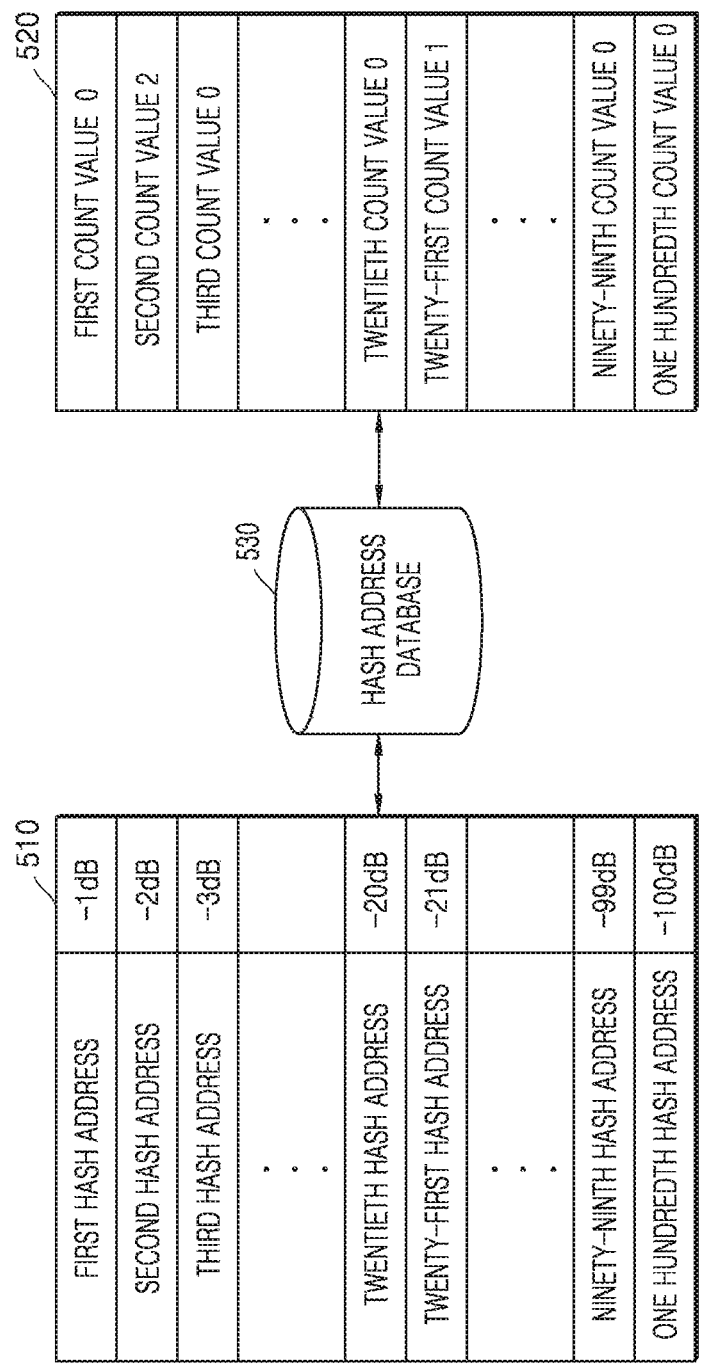
FIG. 5 illustrates a structure of a hash address database according to an embodiment of the disclosure.

FIG. 5 illustrates a structure of a hash address database 530 according to an embodiment of the disclosure. The hash address database 530 may correspond to the hash address database 330 described with reference to FIGS. 2 and 3.

Referring to FIG. 5, a hash address 510 may be represented as a sound level of an audio signal, that is, a short-term sound level. For example, a first hash address may be represented as a −1 dB, a second hash address may be represented as −2 dB, . . . , and a hundredth hash address may be represented as −100 dB. Also, the hash address database 530 may store count information 520 corresponding to the hash address 510. That is, the hash address database 530 may store the count information 520 including first through hundredth count values respectively corresponding to first through hundredth hash addresses.

For example, when first through fourth short-term sound levels that are received are assumed to be respectively −2.3 dB, −1.9 dB, −21 dB, and −20.45 dB, the hash address obtainer 320 may obtain hash addresses respectively corresponding to the first through fourth short-term sound levels as −2 dB, −2 dB, −21 dB, and −20 dB, respectively. Accordingly, according to the control by the controller 230, the hash address database 530 may be updated by cumulatively counting a second count value of a second hash address corresponding to −2 dB by 2, cumulatively counting a twenty-first count value of a twenty-first hash address corresponding to −21 dB by 1, and cumulatively counting a twentieth count value of a twentieth hash address corresponding to −20 dB by 1.

In addition, the hash address database 330 may be initialized by the period of silence detector 340. When a short-term sound level measured by the audio signal sound level measurer 310 is a certain value or lower, the period of silence detector 340 may determine that a period of silence has occurred and may initialize count information stored in the hash address database 330. According to an embodiment of the disclosure, when a period of silence having a short-term sound level of a certain value or lower has occurred, the period of silence detector 340 may change all count values included in count information to 0 to thereby initialize the count information stored in the hash address database 330.

In detail, a period of silence having a short-term sound level of a certain value or lower may occur when audio content is switched. For example, when a user changes the channel, as no audio signal is input to the period of silence detector 340 at a moment when the channel is changed, a short-term sound level measured by the audio signal sound level measurer 310 may be a silence level corresponding to a certain value or lower. A period of silence may occur when a user changes the channel and when an advertisement is reproduced after a broadcast program is finished, that is, when next audio content is reproduced after one piece of audio content has been reproduced. The period of silence detector 340 is not limited to the above description, and may also detect a period of silence at a moment when audio content is switched.

That is, to measure a sound level of audio content, the period of silence detector 340 may determine a point in time when audio content is switched or ended, and may initialize count information of the hash address database 330. When audio content is switched, the hash address database 330 may measure a sound level of the switched audio content by performing the operations performed after the initialization.

The audio content sound level measurer 350 may measure a sound level of audio content based on information stored in the hash address database 330. In detail, the audio content sound level measurer 350 may measure a sound level of the audio content received during a first time period based on count information including the first count value accumulated during the first period.

According to an embodiment of the disclosure, the audio content sound level measurer 350 may calculate an average sound level of audio content based on sound level information including a first sound level and count information including first count information. In detail, the audio content sound level measurer 350 may calculate an average sound level of audio content based on the formula below.

$$\frac{\sum_i (i \text{ sound level}) \times (i \text{ count value})}{\sum_i (i \text{ count value})} \qquad \text{[Equation 1]}$$

Calculation of an average sound level of audio content may also be performed by using any other method that uses sound level information and count information stored in the hash address database 330 other than the above-described formula.

The audio content sound level measurer 350 measures a sound level of audio content based on count information accumulated during a first time period, and thus, a long-term sound level may be measured compared to a short-term sound level measured in units of certain frames by the audio signal sound level measurer 310. Accordingly, the sound level of audio content measured by using the audio content sound level measurer 350 will be below referred to as 'long-term sound level' for convenience. In addition, the measured long-term sound level may be used in automatic sound level adjustment applications. For example, when measuring a long-term sound level, the controller 230 may control also to store a replay time of audio content in the memory 220, and thus, the sound level of the watching of a user may be determined according to each time.

Figure 6:
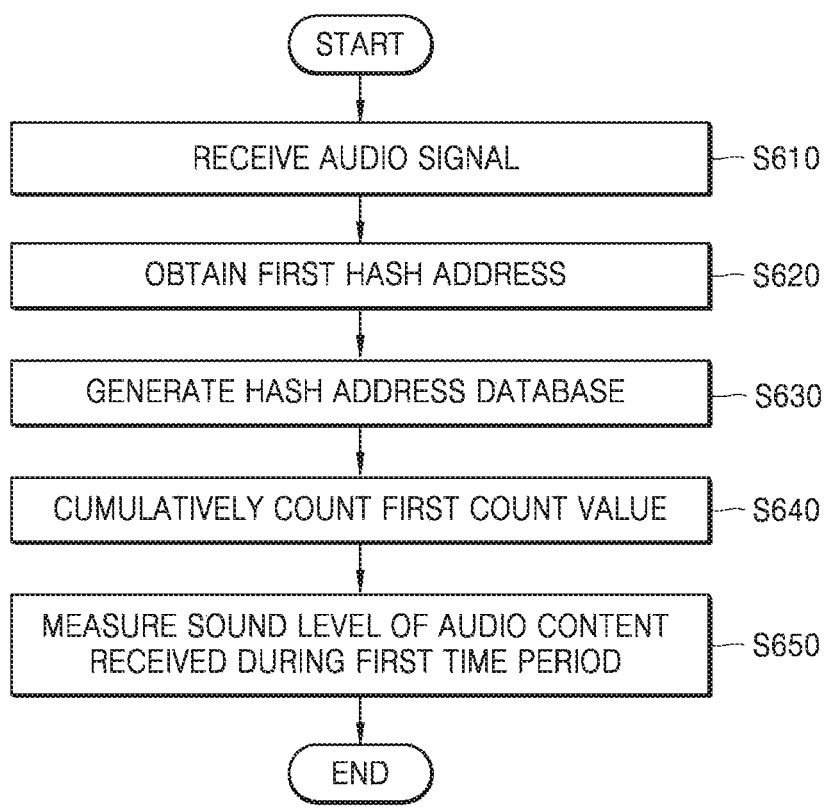
FIG. 6 is a flowchart of a method of measuring a sound level of audio content, according to an embodiment of the disclosure.

FIG. 6 is a flowchart of a method of measuring a sound level of audio content, according to an embodiment of the disclosure. In addition, FIG. 6 is a flowchart of operations performed in the audio content sound level measuring devices 140, 200, and 300 according to embodiments of the disclosure described above with reference to FIGS. 1 through 5.

A method 600 of measuring a sound level of audio content according to an embodiment of the disclosure may be performed using the audio content sound level measuring device 140, 200 or 300 according to embodiments of the disclosure described with reference to FIGS. 1 through 5, and operations performed using the audio content sound level measuring device 140, 200 or 300 may respectively correspond to operations included in the method 600 of measuring a sound level of audio content. Thus, in the description of the method 600, description provided above with reference to FIGS. 1 through 5 will be omitted.

The method 600 of controlling an audio content sound level measuring device is a method of controlling the audio content sound level measuring device 200 including the communicator 210, the memory 220 storing at least one instruction, and the controller 230 including at least one processor executing the at least one instruction.

Referring to FIG. 6, in the method 600 of controlling a sound level measuring device, an audio signal is received from the electronic device 130 via the communicator 210 of the audio content sound level measuring device 200 (S610).

In addition, the controller 230 may receive a first hash address based on a sound level of the received audio signal (S620). In detail, the audio signal sound level measurer 310 may measure a short-term sound level of the received audio signal in SPL values or in RMS values, and the hash address obtainer 320 may convert the measured short-term sound level to a first hash address by using a certain hash function.

In addition, the controller 230 generates a hash address database whereby a sound level of an audio signal is made to correspond to one of a plurality of hash addresses (S630). In detail, the controller 230 may generate the hash address database 330 in which count values respectively corresponding to a plurality of hash addresses obtained using the hash address obtainer 320 are stored, make a sound level of a received audio signal to correspond to a plurality of hash addresses, and control the hash address database 330 to be stored in the memory 220.

In addition, when a first sound level corresponds to a first hash address, and a sound level of an audio signal corresponds to the first sound level, the controller 230 cumulatively counts a first count value of the first hash address (S640).

In addition, the controller 230 measures a sound level of audio content received during a first time period based on count information including the first count value accumulated during the first time period (S650). In detail, the audio content sound level measurer 350 may calculate an average sound level of audio content based on a hash address and count information.

Figure 7:
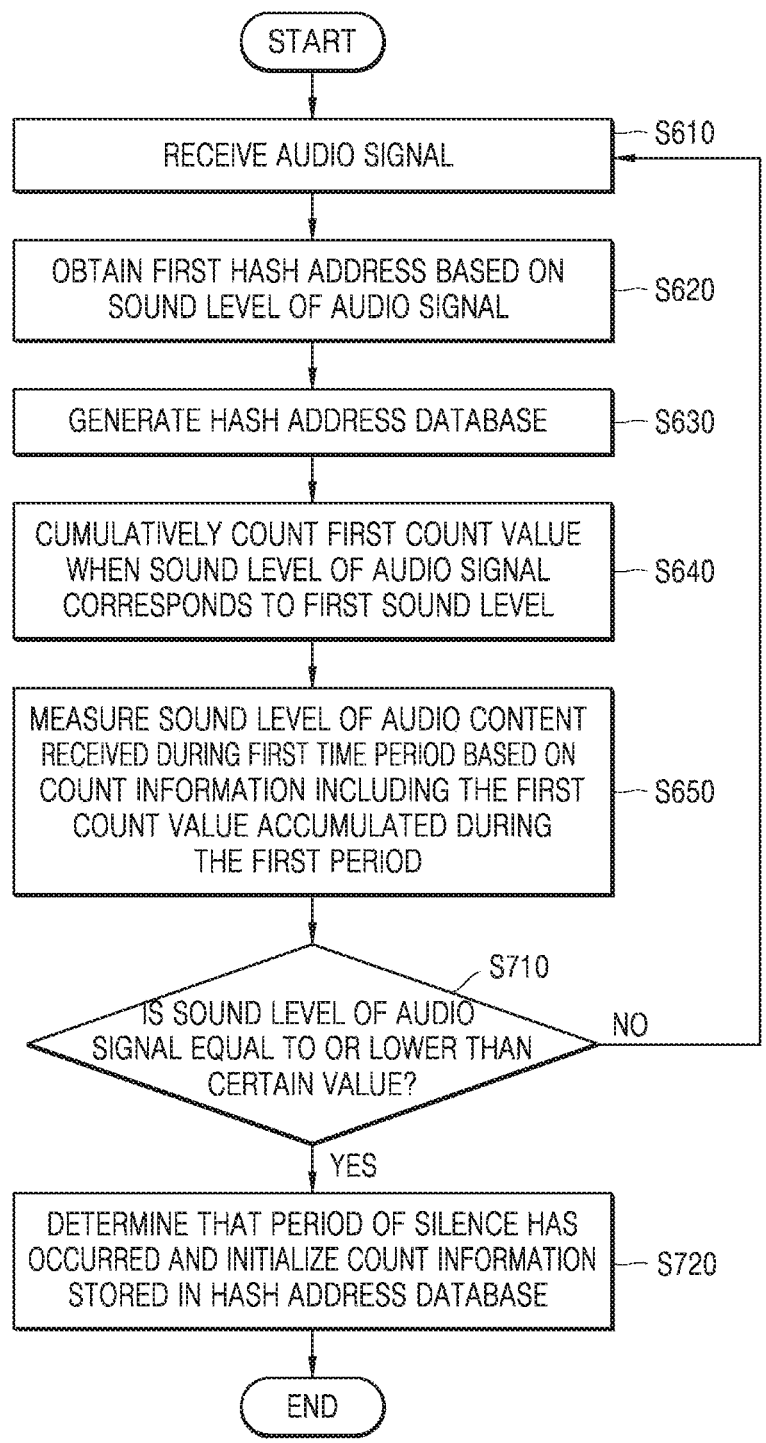
FIG. 7 is a detailed flowchart of a method of measuring a sound level of audio content, according to an embodiment of the disclosure.

FIG. 7 is a detailed flowchart of a method of measuring a sound level of audio content, according to an embodiment of the disclosure. In addition, FIG. 7 is a flowchart of operations performed in the audio content sound level measuring device according to embodiments of the disclosure described above with reference to FIGS. 1 through 5.

In addition, a method 700 of measuring a sound level of audio content according to an embodiment of the disclosure may be performed using the audio content sound level measuring device 140, 200 or 300 according to an embodiment of the disclosure described above with reference to FIGS. 1 through 5, and operations performed using the audio content sound level measuring device 140, 200 or 300 may respectively correspond to operations included in the method 700 of measuring a sound level of audio content. Thus, details that are already described above with reference to FIGS. 1 through 5 will be omitted in the description of the method 700 of measuring a sound level of audio content.

In addition, the method 700 of measuring a sound level of audio content is a further specified embodiment of the method 600 of measuring a sound level of audio content, described with reference to FIG. 6. Accordingly, in the method 700 of measuring a sound level of audio content of FIG. 7, like elements as those of the method 600 of measuring a sound level of audio content are labeled like reference numerals.

The controller 230 determines whether a sound level of a received audio signal is equal to or lower than a certain value (S710). In detail, the period of silence detector 340 may determine whether a short-term sound level measured using the audio signal sound level measurer 310 is equal to or lower than a certain value. When a short-term sound level is not equal to or lower than a certain value, the controller 230 may further continuously perform S610 through S650.

Meanwhile, when a sound level of a received audio signal is equal to or lower than a certain value, the controller 230 determines that a period of silence has occurred and initializes count information stored in the hash address database 330 (S720). In detail, when it is determined that a period of silence has occurred, the controller 230 may regard that first audio content is converted to second audio content and perform operations S610 through S650 again on second audio content received later.

For example, it is assumed that when reproducing first audio content, the audio content sound level measuring device 200 receives, through the communicator 210, sound levels of an audio signal corresponding to −19 dB, −20 dB, −20 dB, −20 dB, −20 dB, −20 dB, −20 dB, −20 dB, 20 dB, 20 dB, −20 dB, −22 dB, −18 dB, −21 dB, −100 dB, −100 dB, −3 dB, and −5 dB.

The controller 230 may obtain a first hash function based on a sound level of a received audio signal. That is, the controller 230 may obtain a nineteenth hash address, a twentieth hash address, a twentieth hash address, a twenty-second hash address, an eighteenth hash address, a twenty-first hash address, a hundredth hash address, a hundredth hash address, a third hash address, and a fifth hash address.

In addition, the controller 230 may generate a hash address database 330 whereby a sound level of an audio signal is made to correspond to one of a plurality of hash addresses.

When a nineteenth sound level corresponding to −18.5 dB or lower and greater than −19.5 dB corresponds to the nineteenth hash address, as the sound level of the received audio signal of −19 dB corresponds to the nineteenth sound level, the controller 230 may cumulatively count a nineteenth count value of the nineteenth hash address. That is, the nineteenth count value may be modified from 0 to 1. Likewise, the controller 230 may perform the same operation on audio signals received in real time, and accordingly, in the generated hash address database 330, an eighteenth count value may be stored as 1, the nineteenth count value may be stored as 1, a twentieth count value may be stored as 10, a twenty-first count value may be stored as 1, a twenty-second count value may be stored as 1, and a hundredth count value may be stored as 2.

When the controller 230 determines a sound level of an audio signal that is equal to or lower than −100 dB, to be a period of silence, at the moment when the hundredth count value becomes 1, the entire count values included in the hash address database 330 may be modified to 0.

The audio signal sound level measurer 350 may measure a sound level of first audio content based on count information including count values accumulated during a first time period. A sound level of first audio content may be obtained by using the formula below.

$$\frac{\sum_i (i \text{ sound level}) \times (i \text{ count value})}{\sum_i (i \text{ count value})} = $$

$$\frac{(-18[dB] \times 1) + (-19[dB] \times 1) + (-20[dB] \times 10) + (-21[dB] \times 1) + (-22[dB] \times 1)}{14} = $$

$$-20[dB]$$

[Equation 2]

The controller 230 may perform the above-described operation again on the sound levels of −3 dB and −5 dB, of audio signals received after the entire count values are modified to 0, thereby measuring a sound level of second audio content.

Hereinafter, a compensation gain calculated according to an embodiment of the disclosure will be described with reference to FIGS. 8A through 9.

Figure 8A:
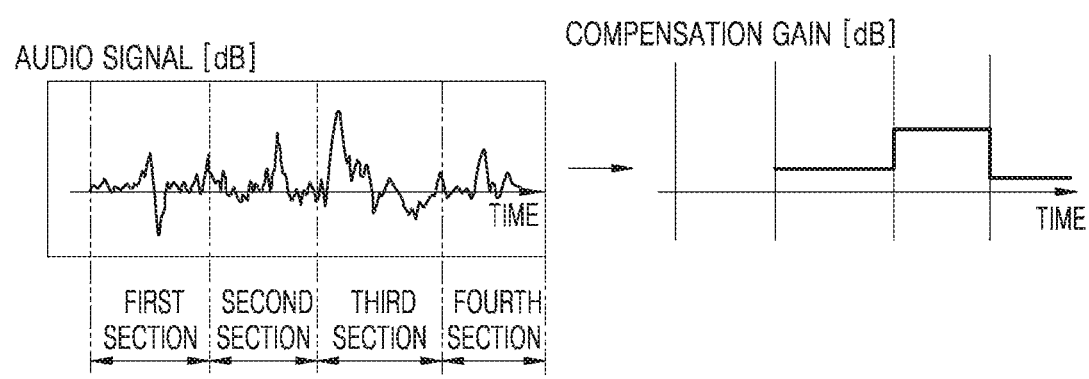
FIG. 8A is a graph of a compensation gain calculated according to the related art.
Figure 8B:
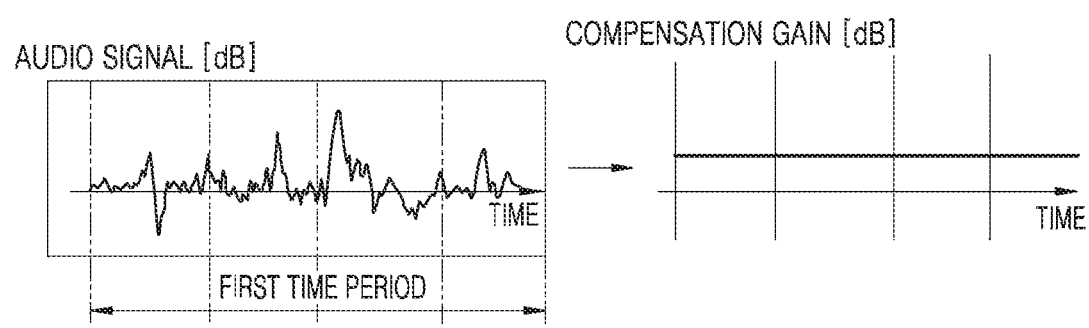
FIG. 8B is a graph of a compensation gain calculated according to an embodiment of the disclosure.

FIG. 8A is a graph of a compensation gain calculated with respect to an audio signal by using a short-term sound level measuring method, and FIG. 8B is a graph of a compensation gain calculated according to an embodiment of the disclosure, with respect to the above audio signal.

Referring to FIG. 8A, a compensation gain calculated with respect to an audio signal of a first section is assumed to be 0 dB. As a sound level of an audio signal of a second section is higher than a sound level of an audio signal received in the first section, a compensation gain calculated with respect to the audio signal in the second section may be greater than the compensation gain calculated with respect to the first section. Likewise, a compensation gain may also be calculated with respect to an audio signal in a third section or a fourth section. That is, according to the related art, different compensation gains are calculated according to time or according to sections at which an audio signal is measured. In addition, according to the short-term sound level measuring method as above, a compensation gain calculated from a previous frame is applied to a next audio signal, and thus, a shape of a waveform of an audio signal is not maintained.

Referring to FIG. 8B, according to an embodiment of the disclosure, the controller 230 may calculate a compensation gain with respect to a sound level of audio content for a first time period. That is, when a first time period during which a sound level of an audio signal is set to a certain time period or longer, a uniform compensation gain may be obtained. For example, when a compensation gain regarding ten frames is calculated, the compensation gain is affected by a next frame by about 10%. Meanwhile, when a compensation gain regarding 1000 frames is calculated, that is, when a compensation gain is calculated by setting a first time period during which an audio signal is measured, to a certain time period or longer, the compensation gain is affected by a next input frame by about 0.1% only. That is, the first time period may be set to a time period in which a calculated average sound level of audio content converges within a certain error range. Accordingly, according to the method of measuring a sound level of audio content according to an embodiment of the disclosure, a stable compensation gain may be measured and applied.

Figure 9:
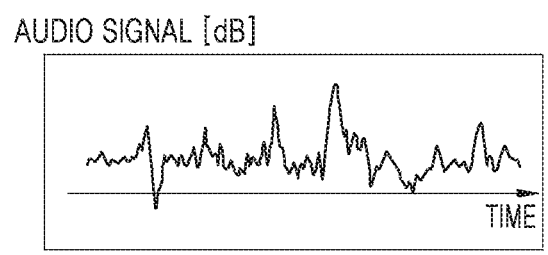
FIG. 9 is a graph of a sound level of an audio signal to which a compensation gain is applied, according to an embodiment of the disclosure.

FIG. 9 is a graph of a sound level of an audio signal to which a compensation gain is applied, according to an embodiment of the disclosure. Referring to FIG. 9, by applying a uniform compensation gain calculated in an embodiment of FIG. 8B, to a received audio signal, a sound level of the audio signal may be increased overall by the compensation gain. That is, a shape of an audio signal waveform may be maintained, and just the sound level of the audio signal may be increased.

According to the method of measuring a sound level of audio content and the device according to the method, according to an embodiment of the disclosure, a sound level of reproduced audio content may be automatically adjusted to increase user convenience, and the demand of a user to reproduce audio content at a target sound level may be satisfied.

In addition, according to the method of measuring a sound level of audio content and the device according to the method, according to an embodiment of the disclosure, accuracy of measurement of the sound level of audio content may be controlled according to the capacity of a hash address database.

The method of measuring a sound level of audio content according to an embodiment of the disclosure may be implemented as program commands that can be executed using various computer components and can be written to a computer-readable recording medium. In addition, embodiments of the disclosure may be implemented as a non-transitory computer-readable recording medium on which is recorded at least one program including instructions executing the method of measuring a sound level of audio content described above.

The computer-readable recording medium may include program commands, a data file, a data structure etc. alone or in combination. The program commands written to the computer-readable recording medium may be specifically designed and configured for embodiments of the disclosure or may be well-known and available to one of ordinary skill in the art of computer software. Examples of the computer-readable recording medium include magnetic media (e.g., hard disks, floppy disks, magnetic tapes, etc.), optical media (e.g., CD-ROMs, or DVDs), magneto-optical media (e.g., floptical disks), and hardware devices specifically configured to store and execute program commands (e.g., ROM, RAM, flash memories, etc.). Examples of the program commands include not only machine codes generated by using a compiler but also high-level language codes that can be executed on a computer by using an interpreter or the like.

In addition, the method of measuring a sound level of audio content according to an embodiment of the disclosure described above may be implemented using a computer program product including a recording medium on which is recorded a program configured to perform: an operation of obtaining a sentence composed of multiple languages; and an operation of obtaining vector values respectively corresponding to words included in the multilingual sentence by using a multilingual translation model, converting the obtained vector values into vector values corresponding to a target language, and obtaining a sentence composed of the target language based on the vector values obtained by the converting.

While one or more embodiments of the disclosure have been described with reference to the figures, the scope of the disclosure is not limited thereto, and it will be understood by those of ordinary skill in the art that various changes in form and details may be made therein without departing from the spirit and scope as defined by the following claims.

What is claimed is:

1. A method of identifying a sound level of an audio content, the method comprising:
   receiving an audio signal and obtaining a first hash address based on a sound level of the audio signal;
   providing a hash address database in which the sound level of the audio signal is made to correspond to a hash address among a plurality of hash addresses;
   based on a first sound level corresponding to the first hash address and the sound level of the audio signal corresponding to the first sound level, cumulatively counting a first count value of the first hash address;
   identifying the sound level of the audio content received during a first time period based on count information corresponding to a total amount of the first count value accumulated during the first time period; and
   identifying a period corresponding to silence based on the sound level of the audio signal being less than or equal to a certain value, and initializing the count information stored in the hash address database.

2. The method of claim 1, wherein the first sound level corresponds to a sound level included in a first section based on a sound level range being divided into a plurality of sections at intervals, and
   wherein the providing the hash address database further comprises providing the hash address database in which each hash address among the plurality of hash addresses is made to correspond to a section among the plurality of sections.

3. The method of claim 2, wherein the cumulatively counting further comprises, based on the sound level of the audio signal being included in the first section, identifying that the sound level of the audio signal corresponds to the first sound level.

4. The method of claim 2, wherein a size of the intervals is inversely related to a capacity of the hash address database.

5. The method of claim 2, wherein the identifying the sound level of the audio content further comprises identifying an average sound level of the audio content based on sound level information that includes the first sound level and the count information.

6. The method of claim 5, wherein a length of the first time period is determined so that a compensation gain converges to a uniform value.

7. The method of claim 1, wherein the initializing comprises adjusting all count values included in the count information to 0.

8. The method of claim 1, further comprising identifying a compensation gain based on a difference between the identified sound level of the audio content and a sound level of an audio signal received after the first time period.

9. The method of claim 8, further comprising adjusting, by the compensation gain, the sound level of the audio signal received after the first time period.

10. A device for identifying a sound level of an audio content, the device comprising:
    a communicator configured to perform communication with an electronic device that reproduces audio content;
    a memory storing at least one instruction; and
    a controller comprising at least one processor for executing the at least one instruction to:
      receive an audio signal and obtain a first hash address based on a sound level of the audio signal;
      provide a hash address database in which the sound level of the audio signal is made to correspond to a hash address among a plurality of hash addresses;
      based on a first sound level corresponding to the first hash address and the sound level of the audio signal corresponding to the first sound level, cumulatively count a first count value of the first hash address;
      identify the sound level of the audio content received during a first time period based on count information corresponding to a total amount of the first count value accumulated during the first time period; and
      identify a period corresponding to silence based on the sound level of the audio signal being less than or equal to a certain value, and initialize the count information stored in the hash address database.

11. The device of claim 10, wherein the processor is further configured to execute the at least one instruction to:
    adjust the first sound level to correspond to a sound level included in a first section based on a sound level range being divided into a plurality of sections at intervals; and
    provide the hash address database in which each hash address among the plurality of hash addresses is made to correspond to a section among the plurality of sections.

12. The device of claim 11, wherein the processor is further configured to execute the at least one instruction to identify, based on the sound level of the audio signal being included in the first section, that the sound level of the audio signal corresponds to the first sound level.

13. The device of claim 11, wherein a size of the intervals is inversely related to a capacity of the hash address database.

14. The device of claim 11, wherein the processor is further configured to execute the at least one instruction to identify an average sound level of the audio content based on sound level information that includes the first sound level and the count information.

15. The device of claim 14, wherein a length of the first time period is determined so that a compensation gain converges to a uniform value.

16. The device of claim 10, wherein the processor is further configured to execute the at least one instruction to adjust all count values included in the count information to 0.

17. The device of claim 10, wherein the processor is further configured to execute the at least one instruction to identify a compensation gain based on a difference between the identified sound level of the audio content and a sound level of an audio signal received after the first time period.

18. The device of claim 17, wherein the processor is further configured to execute the at least one instruction to adjust, by the compensation gain, the sound level of the audio signal received after the first time period.

19. A device for identifying a sound level of an audio content, the device comprising:
- a communicator configured to perform communication with an electronic device that reproduces audio content;
- a memory storing at least one instruction; and
- a controller comprising at least one processor for executing the at least one instruction to:
  - receive an audio signal and obtain a first hash address based on a first sound level of the audio signal and a second hash address based on a second sound level of the audio signal;
  - provide a hash address database in which the first and second sound levels of the audio signal correspond to respective hash addresses among a plurality of hash addresses;
  - based on a sound level of the audio signal corresponding to the first sound level, cumulatively count a first count value of the first hash address;
  - based on a sound level of the audio signal corresponding to the second sound level, cumulatively count a second count value of the second hash address; and
  - identify the sound level of the audio content received during a first time period based on count information corresponding to a total amount of the first count value and the second count value accumulated during the first time period.

* * * * *